(12) United States Patent
Chang et al.

(10) Patent No.: US 8,644,074 B2
(45) Date of Patent: Feb. 4, 2014

(54) NONVOLATILE MEMORY DEVICE, PROGRAMMING METHOD THEREOF AND MEMORY SYSTEM INCLUDING THE SAME

(75) Inventors: Sung-Il Chang, Hwaseong-si (KR); Changseok Kang, Seongnam-si (KR); Chan Park, Gwangju (KR); Byeong-In Choe, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 326 days.

(21) Appl. No.: 13/107,139

(22) Filed: May 13, 2011

(65) Prior Publication Data

US 2011/0286274 A1    Nov. 24, 2011

(30) Foreign Application Priority Data

May 19, 2010 (KR) .......................... 10-2010-0046988

(51) Int. Cl.
*G11C 11/34* (2006.01)
(52) U.S. Cl.
USPC ................................ 365/185.17; 365/189.09
(58) Field of Classification Search
USPC ........................................ 365/185.17, 189.09
See application file for complete search history.

(56) References Cited

U.S. PATENT DOCUMENTS

| 7,120,074 B2 | 10/2006 | Proell et al. |
| 7,466,597 B2 * | 12/2008 | Kim .......................... 365/185.28 |
| 2005/0078537 A1 | 4/2005 | So et al. |

FOREIGN PATENT DOCUMENTS

| JP | 2005-108307 | 4/2005 |
| KR | 1020070080037 | 8/2007 |
| KR | 1020080076006 | 8/2008 |

* cited by examiner

*Primary Examiner* — Son Dinh
*Assistant Examiner* — Nam Nguyen
(74) *Attorney, Agent, or Firm* — F. Chau & Associates, LLC

(57) ABSTRACT

A nonvolatile memory device preventing a program disturb, a program method thereof and a memory system including the nonvolatile memory device and the program method. The nonvolatile memory device includes a memory cell array; first and second word lines connected to a NAND string in the memory cell array; a third word line connected to the NAND string, the third word line being disposed between the first and second word lines; a temperature sensor configured to measure the temperature of the nonvolatile memory device; and a voltage generator configured to generate first and second pass voltages and a program voltage, and the voltage level of at least one of the first and second pass voltages is controlled according to the measured temperature. When a program operation is performed, the program voltage is applied to the third word line, the first pass voltage is applied to the first word line, the second pass voltage is applied to the second word line.

20 Claims, 12 Drawing Sheets

Fig. 5

|         | ROT1   | ROT2   | ROT3   |
|---------|--------|--------|--------|
| CSL     | Vcsl   | Vcsl   | Vcsl   |
| GSL     | Vss    | Vgs1   | Vgs2   |
| DWL1    | Vdm1   | Vdm2   | Vdm4   |
| WL0, WL1 | Vpass1 | Vpass2 | Vpass4 |
| WL2(Selected) | Vpgm | Vpgm | Vpgm |
| WL3~WLm-1 | Vpass1 | Vpass3 | Vpass5 |
| DML2    | Vdm1   | Vdm3   | Vdm5   |
| SSL     | Vcc    | Vcc    | Vcc    |
| BL1     | Vcc    | Vcc    | Vcc    |

Fig. 6

| Temperature Sensor | Control Logic | Voltage generator | | | | |
|---|---|---|---|---|---|---|
| TS1 | PC1 | Vpgm | Vpass1 | | Vdm1 | |
| TS2 | PC2 | Vpgm | Vpass2 | Vpass3 | Vdm2 | Vdm3 | Vgs1 |
| TS3 | PC3 | Vpgm | Vpass4 | Vpass5 | Vdm4 | Vdm5 | Vgs2 |

NONVOLATILE MEMORY DEVICE, PROGRAMMING METHOD THEREOF AND MEMORY SYSTEM INCLUDING THE SAME

CROSS-REFERENCE TO RELATED APPLICATIONS

This U.S. non-provisional patent application claims priority under 35 U.S.C. §119 of Korean Patent Application No. 10-2010-0046988, filed on May 19, 2010, the entire contents of which are hereby incorporated by reference.

BACKGROUND OF THE INVENTIVE CONCEPT

1. Technical Field

The present inventive concept herein relates to semiconductor memory device, and more particularly, to a method of programming a nonvolatile memory device.

2. Discussion of the Related Art

Semiconductor memory devices are made of a semiconductor material such as silicon (Si), germanium (Ge), gallium arsenide (GaAs), indium phosphide (InP). Semiconductor memory devices are classified into volatile memory devices and nonvolatile memory devices.

Volatile memory devices lose their stored data when power supplied is interrupted. The various types of volatile memory include a static random access memory (SRAM), a dynamic RAM (DRAM), a synchronous DRAM (SDRAM). Nonvolatile memory devices maintain their stored data even when power supply is interrupted.

The various types of nonvolatile memory devices include a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM). A flash memory device is classified into a NOR type and a NAND type depending on whether its memory cells are accessed individually or instead connected in series in "NAND strings".

SUMMARY

An aspect of the inventive concept provide a nonvolatile memory device comprising: a memory cell array including a NAND string; first and second word lines connected to the NAND string; a third word line connected to the NAND string, the third word line being disposed between the first and second word lines; a temperature sensor configured to measure the temperature of the nonvolatile memory device; and a voltage generator configured to generate first and second pass voltages and a program voltage. While a program operation is performed, the program voltage is applied to the third word line, the first pass voltage is applied to the first word line, the second pass voltage is applied to the second word line and the voltage level of at least one of the first and second pass voltages is controlled according to the measured temperature.

An aspect of the inventive concept also provides a memory system including a nonvolatile memory device comprising: a memory cell array and first through third word lines and generating first and second pass voltages and a program voltage in response to a control signal; and a memory controller measuring the temperature of the memory system (thus measuring the temperature of the semiconductor including the channel of a NAND string to be programmed) and transferring a control signal and a temperature signal based on the measured temperature to the nonvolatile memory device. While a program operation is performed, the program voltage is applied to the third word line, first pass voltage is applied to the first word line and the second pass voltage is applied to the second word line, and wherein the nonvolatile memory device is configured to control the level of at least one of the first and second pass voltages based on the measured temperature.

An aspect of the inventive concept also provides a program method of a nonvolatile memory device including first and second word lines connected to a NAND string and a third word line connected to the NAND string and disposed between the first and second word lines. The method includes measuring the temperature of the nonvolatile memory device; generating first and second pass voltages and a program voltage wherein the level of at least one of the first and second pass voltages is controlled according to the measured temperature; and applying the program voltage to the third word line, applying the first pass voltage to the first word line and applying the second pass voltage to the second word line.

Preferred embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. Like numbers refer to like elements throughout.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the figures:

FIG. 5 is a table illustrating pass voltages applied to the NAND string 300 in accordance with a second embodiment of the inventive concept.

FIG. 6 is a table illustrating voltages of FIG. 5 generated according to a temperature signal and a control signal of FIG. 1.

DETAILED DESCRIPTION OF EXEMPLARY EMBODIMENTS OF THE INVENTION

Figure 1:
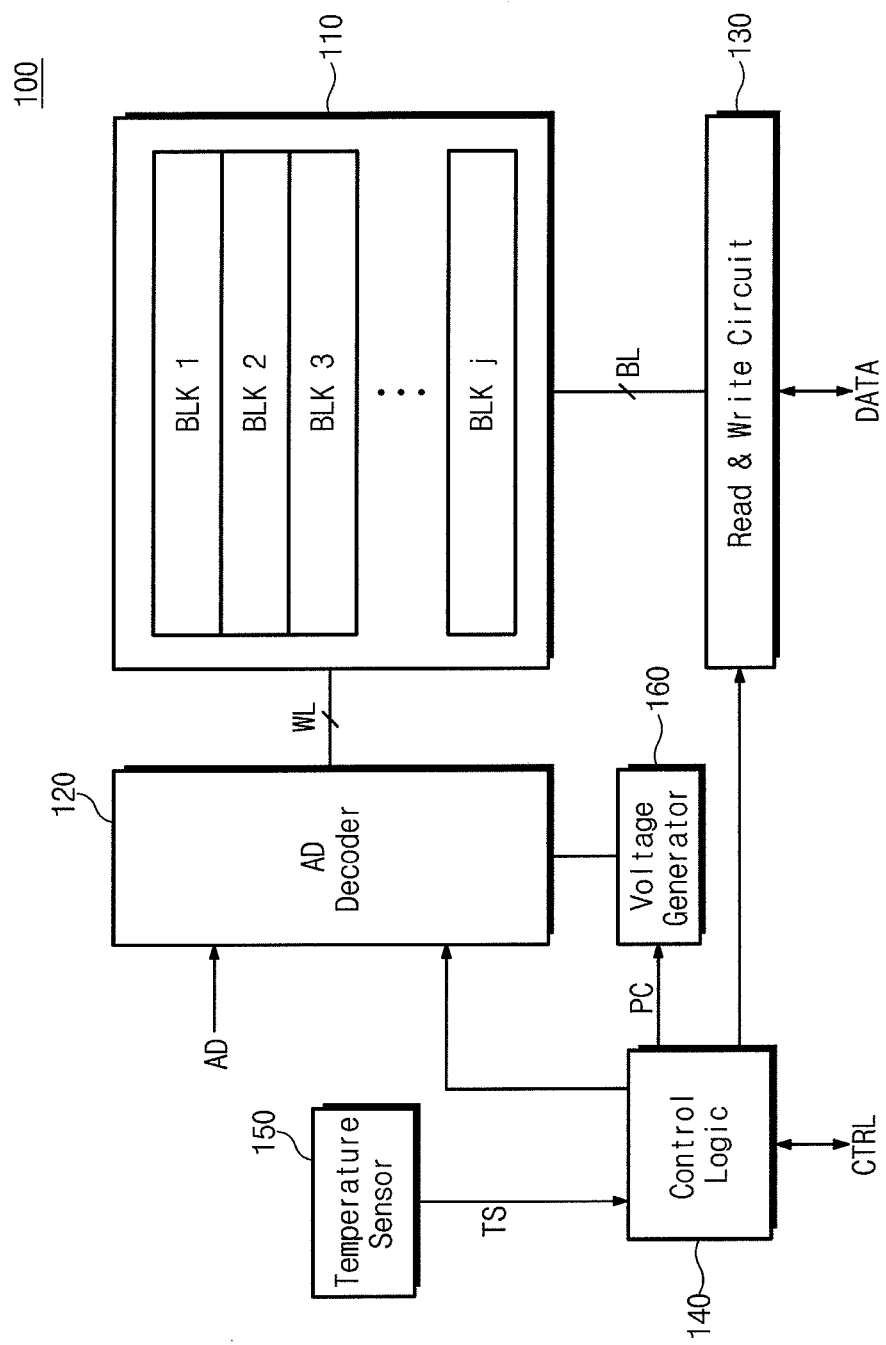
FIG. 1 is a block diagram of a nonvolatile memory device 100 including a temperature sensor 150 in accordance with an exemplary embodiment of the inventive concept.

FIG. 1 is a block diagram of a nonvolatile memory device 100 including a temperature sensor 150 in accordance with exemplary embodiments of the inventive concept.

Referring to FIG. 1, a nonvolatile memory device 100 includes a memory cell array 110, an address decoder 120 connected to a plurality of word lines WL, a read and write circuit 130 connected to a plurality of bit lines BL, control logic 140, a temperature sensor 150 and a voltage generator 160.

The nonvolatile memory device 100 includes at least one of a flash memory, an electrically erasable and programmable ROM (EEPROM), a phase-change RAM (PRAM), a magnetic RAM (MRAM) and a resistive RAM (RRAM).

The memory cell array 110 of a flash memory includes a plurality of blocks (BLK1-BLKi). Each memory block is comprised of a plurality of pages (for example, 32 pages, 64 pages). Memory cells arranged in a row direction are connected to word lines (WL). If memory cells are single level cell (SLC), flash memory cells connected to one word line can constitute one page. If memory cells are multi level cell (MCL), memory cells connected to one word line can constitute a plurality of pages. Memory cells arranged in the column direction in each block are connected in series to the same bit line (BL) in a NAND string. The memory cells sharing a channel and connected to one bit line (BL) constitute one NAND string. In a case of a NAND flash memory, an erasure operation is performed block by block (all wordlines at a time) and a read/write operation is performed by a page by page (e.g., one word line at a time).

The address decoder 120 is connected to the memory cell array 110 through word lines (WL). The address decoder 120 is configured to operate under the control of the control logic 140. The address decoder 120 receives an address (AD) from the outside.

The address decoder 120 is configured to select a row (word line) and a block based on the received addresses (AD). The address decoder 120 selects word lines (WL) of the selected block and applies a power supply voltage, a ground voltage and voltages provided from the voltage generator 160 to the word lines (WL) on the basis of the received address.

A column address among the received addresses (AD) is transferred (e.g., from the address decoder 120) to the read and write circuit 130. The address decoder 120 may include a block decoder, a row decoder, a column decoder and an address buffer.

The read and write circuit 130 is connected to the memory cell array 110 through bit lines (BL). The read and write circuit 130 operates in response to the control of the control logic 140. The read and write circuit 130 is configured to receive the decoded column address (e.g., from the address decoder 120). The read and write circuit 130 selects bit lines (BL) using the decoded column address. When a program operation is performed, a ground voltage is applied to bit lines connected to the memory cells to be programmed. The power supply voltage is applied to bit lines connected to the program inhibit memory cells.

The read and write circuit 130 receives data (DATA). The read and write circuit 130 writes the received data in the memory cell array 110. The read and write circuit 130 can read data from the memory cell array 110. Also, the read and write circuit 130 reads data from a first storage area of the memory cell array 110 and can copy-back program the read data into the same or to a second storage area of the memory cell array 110.

The read and write circuit 130 may include a page buffer (or a page register), a column select circuit, etc. In another example, the read and write circuit 130 can include a sensor amplifier, a writing driver, a column select circuit, etc.

The nonvolatile memory device 100 may further include a data input/output circuit (not illustrated) foe receiving data (DATA) from the outside. In this case, the data input/output circuit operates in response to the control of the control logic 140. The data input/output circuit is configured to exchange data with the outside. When a program operation is performed, the data input/output circuit is configured to transfer the received data (DATA) from the outside to the read and write circuit 130.

The control logic 140 is connected to the address decoder 120, the read and write circuit 130, the temperature sensor 150 and the voltage generator 160. The control logic 140 is configured to control all the operations of the nonvolatile memory device 100. The control logic 140 operates in response to control signal (CTRL) transferred from the outside. The control logic 140 transfers a program control signal, a read control signal or an erasure control signal to the voltage generator 160 in response to the control signal (CTRL). When transferring a program control signal, the control logic 140 transfers the program signal to the voltage generator 160 based on the temperature signal (TS) received from the temperature sensor 150.

The temperature sensor 150 is connected to the control logic 140. The temperature sensor 150 is configured to generate and transfer the temperature signal (TS) to the control logic 140 (e.g., in response to a control of the control logic 140). For example, in response to the control signal (CTRL), the control logic 140 transfers a call signal (not illustrated) to the temperature sensor 150. The temperature sensor 150 transfers the temperature signal (TS) to the control logic 140 in response to the call signal. the control logic 140 outputs the program control signal (PC) based on the temperature signal (TS), to the voltage generator 160.

The voltage generator 160 is connected to the address decoder 120. The voltage generator 160 operates in response to the control of the control logic 140. The voltage generator 160 provides voltages to be applied through the address decoder 120 to word lines WL in response to the program control signal (PC). For example, in response to the program control signal (PC), the voltage generator 160 modifies the power supply voltage and distributes the modified (e.g., amplified) voltage to generate various high voltages. The generated high voltages will be provided to the address decoder 120.

Figure 2:
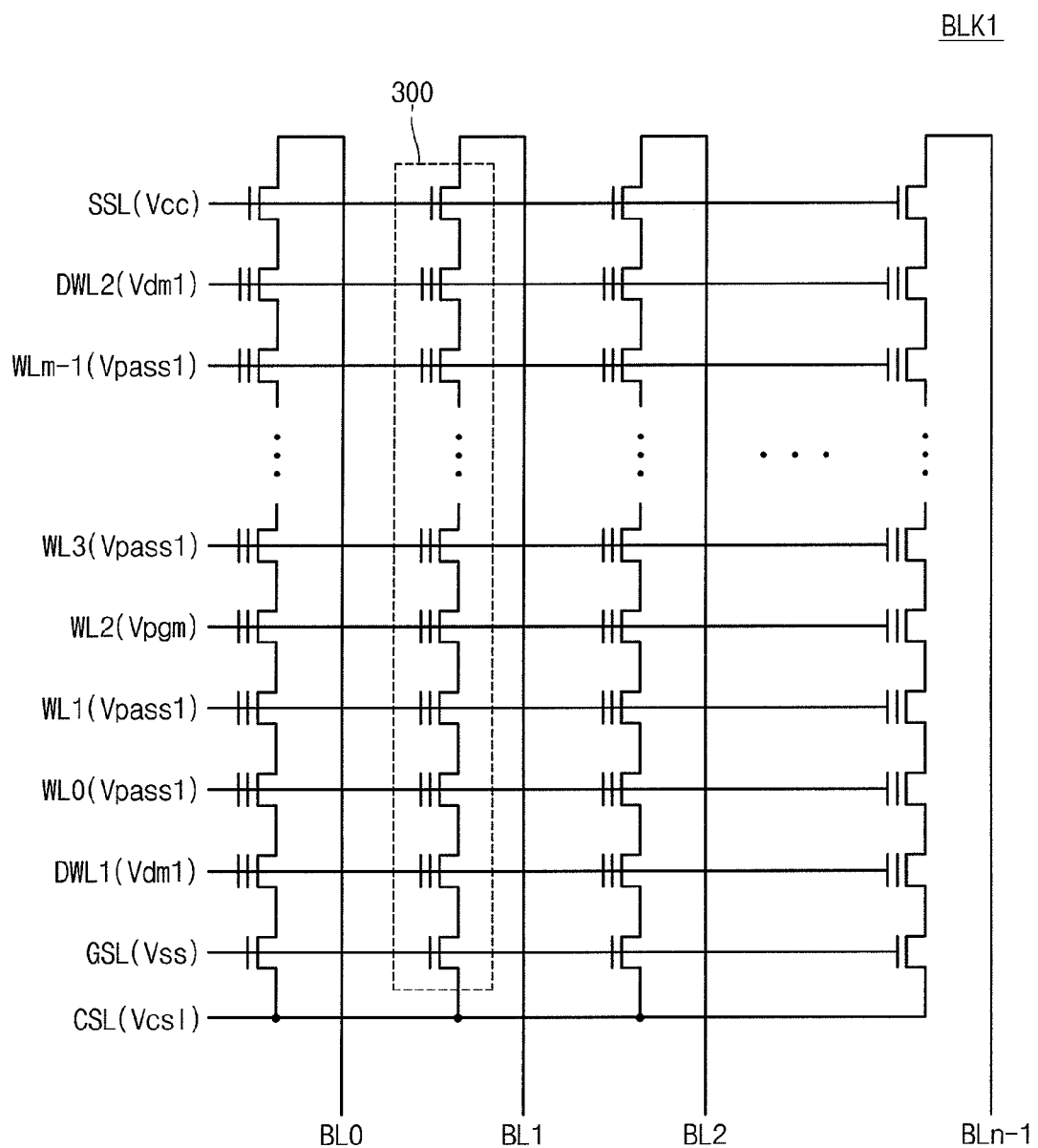
FIG. 2 is a circuit diagram of a plurality of NAND strings in the memory block BLK 1 in the memory cell array 110 in the nonvolatile memory device 100 of FIG. 1.

FIG. 2 is a circuit diagram of a plurality of NAND strings in a first memory block (BLK1) in the memory cell array 110 in the nonvolatile memory device 100 of FIG. 1. Hereinafter, while the form of the first memory block (BLK1) is described with reference to FIG. 2, second through jth memory blocks (BLK2-BLKJ) (in FIG. 1) have the same form as the first memory block (BLK1). To describe features of the inventive concept, in FIG. 2, word line voltages (e.g., Vpgm, Vpass1, etc.) applied while a writing operation is performed on the memory cells connected to a second word line (WL2) are annotated in the parentheses at the wordlines WL.

Referring to FIG. 2, the first memory block (BLK1) includes a plurality of memory cells arranged in a plurality of NAND strings, each NAND string including a channel (formed in the semiconductor) and a plurality of transistors. In the first memory block (BLK1), memory cells connected to one another in a row direction are connected to first and second dummy word lines (DWL1, DWL2) and 0-th through (m−1)th to word lines (WL0-WLm−1). Memory cells connected to one another in a column direction are connected in series to one of the bit lines 0 through (m−1)th (BL0-BLn−1).

The first memory block (BLK1) includes string select transistors connected to a string select line (SSL) and ground select transistors connected to a ground select line (GSL). The ground select transistors connected to the ground select line (GSL) are connected to a common source line (CSL).

When a program operation is performed on the first memory block (BLK1), the first memory block (BLK1) is activated. Thus, the address decoder 120 decodes a block address among the addresses (AD). The first memory block (BLK1) is selected according to the decoded block address.

When a program operation is performed, a voltage higher than threshold voltage of the string select transistors connected to the string select line (SSL) is applied to the string select line (SSL). For example, a power supply voltage (Vcc) may be applied to the string select line (SSL). A ground voltage (Vss) may be applied to the ground select line (GSL). A common source line voltage (Vcs1) may be applied to the common source line (CSL). The common source line voltage (Vcs1) may be, for example, 2V.

When a program operation is performed, a program voltage (Vpgm) is applied to the selected word line (e.g., the word line WL2 of the page to be programmed). The program voltage (Vpgm) may be, for example, 18V. A first pass voltage (Vpass1) is applied to the adjacent unselected word lines (e.g., WL0, WL1, WL3). The first pass voltage (Vpass) may be, for example, 9V. A first dummy line voltage (Vdm1) is applied to the first and second dummy word lines (DWL1, DWL2). The level of the first dummy word line voltage (Vdm1) may be equal to the level of the first pass voltage (Vpass1).

Thus while the program voltage (Vpgm) is applied to the selected second word line (WL2), the first pass voltage (Vpass1) is applied to adjacent 0-th and 1st word lines WL0, WL1 and third through (m−1)th word lines (WL3-WLm−1).

The ground voltage (Vss) is applied to bit lines BL connected to NAND strings containing a memory cell to be programmed among the memory cells connected to the second word line (WL2). A program inhibit voltage (e.g., a power supply voltage Vcc) is applied to bit lines connected NAND strings containing program-inhibit memory cells among memory cells connected to the second word line (WL2).

Memory cells of the memory block can be programmed in the predetermined order word line by word line. For example, a writing operation is performed on memory cells connected to 0 word line (WL0). A writing operation is performed on memory cells connected to 1 word line (WL1). A writing operation is performed on memory cells connected to 2 word line (WL2). A writing operation may be sequentially performed on 0 through (m−1)th word lines (WL0-WLm−1).

In this case, when a writing operation is performed on the second word line (WL2), data has already been written into memory cells connected to 0-th and 1st word lines (WL0, WL1). Thus, data is already written into memory cells connected to word lines disposed between the selected word line and the ground select line (GSL).

Figure 3:
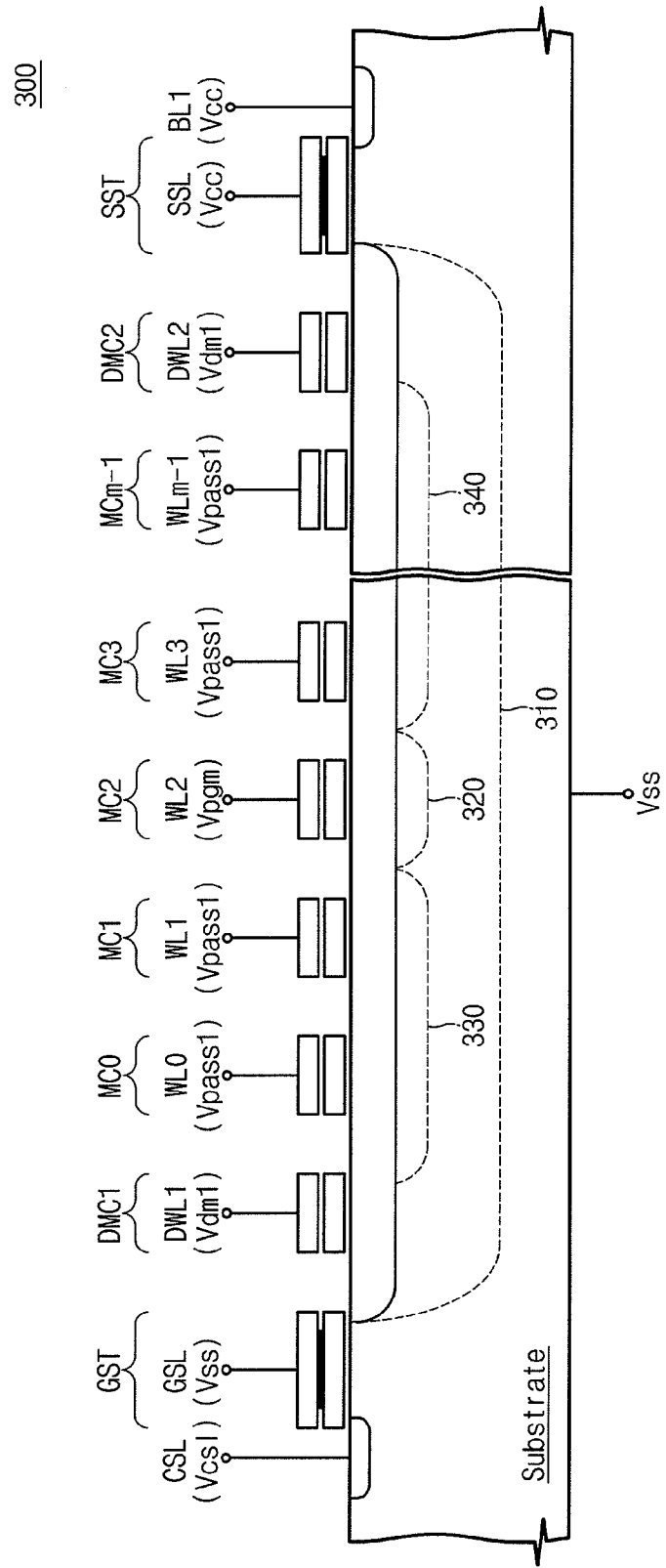
FIG. 3 is a cross-sectional view of NAND string 300 in FIG. 2 formed on a semiconductor Substrate, illustrating the channel formed by voltages applied when the temperature of the nonvolatile memory device 100 is at a reference temperature.

FIG. 3 is a cross-sectional view of NAND string 300 in FIG. 2 formed on a semiconductor Substrate illustrating the channel formed by voltages applied when the temperature of the nonvolatile memory device 100 is at a reference temperature. FIG. 3 illustrates a case when the power supply voltage (Vcc) is applied to a first bit line (BL1).

Referring to FIG. 3, the first string 300 includes first and second dummy memory cells (DMC1, DMC2), a string select transistor (SST), a ground select transistor (GST) and 0-th through (m−1)th memory cells (MC0-MCm−1).

Each of the select transistors (SST, GST) has a control gate electrically connected to a vestigial floating gate through via. In this case, the select transistors (SST, GST) operate like an ordinary (non-memory) NMOS transistor.

A string select line (SSL) is connected to the gate of the string select transistor (SST). A first bit line (BL1) is connected to the drain of the string select transistor (SST). A power supply voltage (Vcc) is applied to the gate and drain of the string select transistor (SST). When the difference between the level of the power supply voltage (Vcc) and the level of a source voltage of the string select transistor (SST) is less than the level of a threshold voltage of the string select transistor (SST), the string select transistor (SST) becomes shut OFF.

A ground select line (GSL) is connected to the ground select transistor (GST). A common source line (CSL) is connected to a source of the ground select transistor (GST). A ground voltage (Vss) is applied to the gate of the ground select transistor (GST). A common source line voltage (Vcs1) is applied to the common source line (CSL). At this time, the ground select transistor (GST) becomes shut OFF. Thus, the first and second dummy memory cells (DMC1, DMC2) and the 0-th through (m−1)th memory cells (MC0-MCm−1) maintain a floating state.

A first dummy word line voltage (Vdm1) is applied to the first and second dummy memory cells (DMC1, DMC2). A first pass voltage (Vpass1) is applied to unselected word lines (WL0, WL1, WL3-WLm−1). A program voltage (Vpgm) is applied to the selected word line (WL2). Since the first and the second dummy memory cells (DMC1, DMC2) and 0-th through (m−1)th memory cells (MC0-MCm−1) maintain a floating state, an electric potential of a first region 310 rises according to a channel boosting effect.

According to a program order described with reference to FIG. 2, the 0-th and 1st memory cells (MC0, MC1) may already have a threshold voltage corresponding to a programmed state. The third through (m−1)th memory cells (MC3-MCm−1) may have a threshold voltage corresponding to an erasure state. A third region 330 may have a lower electric potential than a fourth region 340 due to a threshold voltage of the 0-th and 1st memory cells (MC0, MC1). At this time, a horizontal electric potential difference is generated. An electric field occurs within the substrate. Thus, electrons included in the substrate can move from the third region 330 to the fourth region 340.

As the temperature of the nonvolatile memory device 100 becomes high, the vibration of molecules in the substrate increases. The moving speed of electrons is reduced by vibration of molecules of the substrate, thus the electrical resistance of the substrate increases with increasing temperature. As the temperature of the nonvolatile memory device 100 becomes lower, the vibration of molecules of the substrate is reduced. Thus, as the temperature of the nonvolatile memory device 100 becomes low, the moving speed of electrons may increase. As the moving speed of electrons increases, the probability that a hot carrier injection occurs increases. Thus, the probability that electrons are injected into floating gates of the 0-th through (m−1)th memory cells (MC0-MCm−1) increases with decreasing temperature. Thus, the possibility that threshold voltages of the 0-th through (m−1)th memory cells (MC0-MCm−1) are changed increases with decreasing temperature. Thus, while the temperature of the nonvolatile memory device 100 becomes low, the probability that a program disturb in accordance with an electron movement in a boosted channel may increase.

Figure 4:
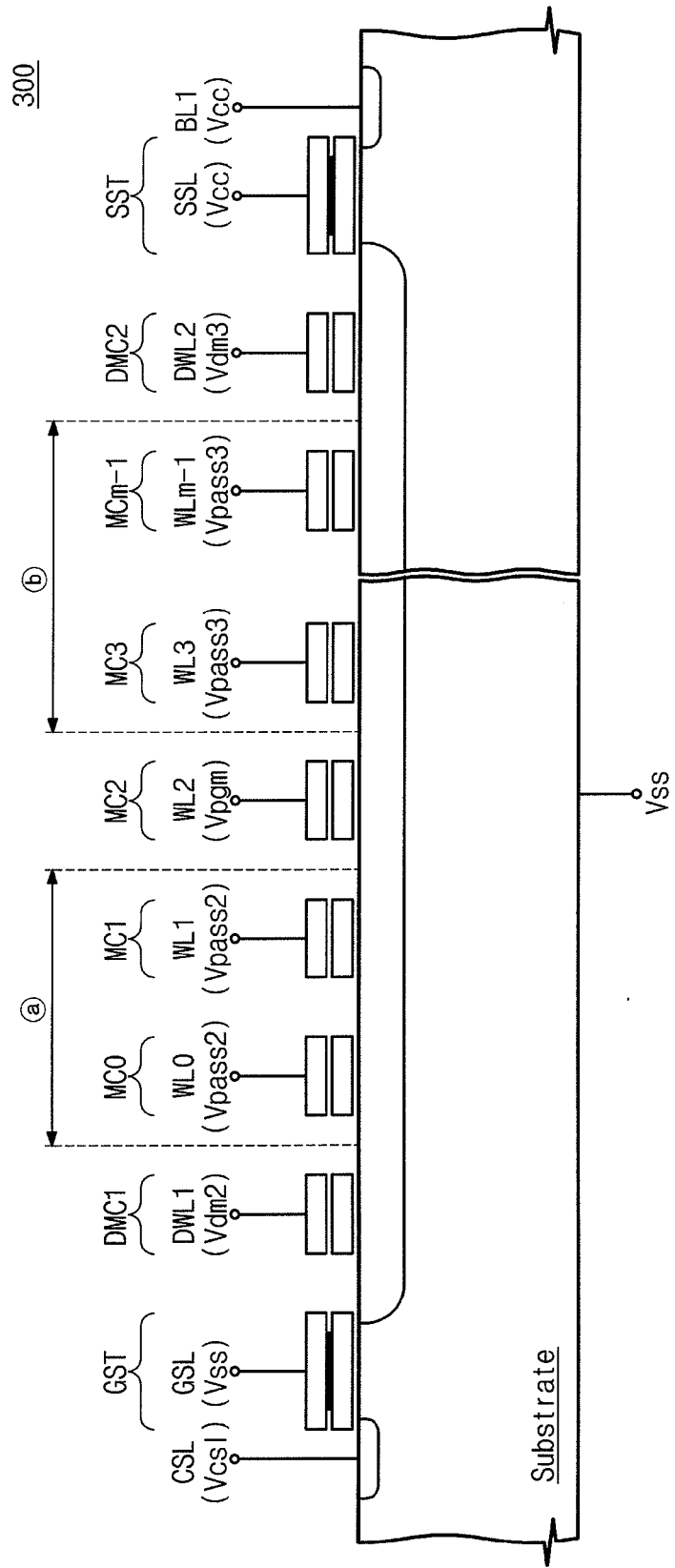
FIG. 4 is a cross-sectional view of NAND string 300 in FIG. 2, illustrating the channel formed by pass voltages applied in accordance with a first embodiment of the inventive concept.

FIG. 4 is a cross-sectional view of NAND string 300 in FIG. 2, illustrating the channel formed by pass voltages applied in accordance with a first embodiment of the inventive concept.

Referring to FIGS. 3 and 4, the common source line voltage (Vcs1) is applied to the common source line (CSL). The power supply voltage (Vcc) is applied to the string select line (SSL). The power supply voltage (Vcc) is applied to the first bit line (BL1).

FIG. 3 illustrates, as an example, that the power supply voltage (Vcc) is applied to the ground select line (GSL). However, when the temperature measured in the temperature sensor 150 is lower than the reference temperature, a voltage applied to the ground select line (GSL) may be varied. This will be described in detail with reference to FIG. 5.

Word lines between the selected word line and the ground select line (GSL) belong to a first group (a). When the temperature measured in the temperature sensor 150 is lower than the reference temperature, a second pass voltage (Vpass2) is applied to the word lines corresponding to the first group (a).

Word lines between the selected word line and the string select line SSL belong to a second group {circle around (b)}. When the temperature measured in the temperature sensor 150 is lower than the reference temperature, a third pass voltage (Vpass3) is applied to the word lines corresponding to the second group {circle around (b)}. The third pass voltage (Vpass3) is lower than the second pass voltage (Vpass2).

A second dummy word line voltage (Vdm2) is applied to the first dummy word line (DWL1). A third dummy word line voltage (Vdm3) is applied to the second dummy word line (DWL2). The second dummy word line voltage (Vdm2) is higher than the third dummy word line voltage (Vdm3).

The first ground select voltage (Vgs1) higher than the ground voltage (Vss) is applied to the ground select line (GSL). The level of the first ground select voltage (Vgs1) is lower than the threshold voltage of the ground select transistor (GST).

FIG. 5 is a table illustrating pass voltages applied to the NAND string 300 in accordance with a second embodiment of the inventive concept. The temperature values included in the second temperature range (ROT2) are smaller than the temperature values included in the first temperature range (ROT1). The temperature values included in the third temperature range (ROT3) are smaller than the temperature values included in the second temperature range (ROT2). Temperature values that can be measured in the nonvolatile memory device 100 are included in one of the first through third temperature ranges (ROT1-ROT3).

Referring to FIGS. 2 and 5, in the first temperature range (ROT1), as described with reference to FIG. 3, voltages in the ROT1 column of FIG. 5 are respectively applied to the NAND string 300. The ground voltage (Vss) is applied to the ground select line (GSL). The common source line voltage (Vcs1) is applied to the common source line (CSL). The first dummy word line voltage (Vdm1) is applied to the first and second dummy word lines (DWL1, DWL2). The first pass voltage (Vpass1) is applied to 0-th, 1st and 3rd through (m−1)th word lines (WL0, WL1, WL3-WLm−1). The program voltage (Vpgm) is applied to the selected second word line (WL2).

The power supply voltage (Vcc) is applied to the string select line (SSL) and the first bit line (BL1).

In the second temperature range (ROT2), the first ground select voltage (Vgs1) is applied to the ground select line (GSL). The level of the first ground select voltage (Vgs1) is higher than the ground voltage (Vss). The level of the first ground select voltage (Vgs1) is lower than the threshold voltage of the ground select transistor (GST).

The second dummy word line voltage (Vdm2) is applied to the first dummy word line (DWL1). The level of the second dummy word line voltage (Vdm2) is higher than the level of the first dummy word line voltage (Vdm1). A third dummy word line voltage (Vdm3) is applied to the second dummy word line (DWL2). The level of the third dummy word line voltage (Vdm3) is lower than the level of the first dummy word line voltage (Vdm1).

The second pass voltage (Vpass2) is applied to the 0-th and 1st word lines (WL0, WL1). The level of the second pass voltage (Vpass2) is higher than the level of the first pass voltage (Vpass1). The third pass voltage (Vpass3) is applied to the third through (m−1)th word lines (WL3-WLm−1). The level of the third pass voltage (Vpass3) is lower than the level of the first pass voltage (Vpass1).

In the third temperature range (ROT3), a second ground select voltage (Vgs2) is applied to the ground select line (GSL). Fourth and fifth dummy word line voltages (Vdm4, Vdm5) are applied to the first and second dummy word lines (DWL1, DWL2), respectively.

The level of the second ground select voltage (Vgs2) is higher than the level of the first ground select voltage (Vgs1). The level of the second ground select voltage (Vgs2) is lower than the threshold voltage of the ground select transistor (GST). The level of the fourth dummy word line voltage (Vdm4) is higher than the level of the second dummy word line voltage (Vdm2). The level of the fifth dummy word line voltage (Vdm5) is higher than the level of the third dummy word line voltage (Vdm3).

A fourth pass voltage (Vpass4) is applied to the 0-th and 1st word lines (WL0, WL1). A fifth pass voltage (Vpass5) is applied to the third through (m−1)th word lines (WL3-WLm−1). The level of the fourth pass voltage (Vpass4) is higher than the level of the second pass voltage (Vpass2). The level of the fifth pass voltage (Vpass5) is higher than the level of the third pass voltage (Vpass3).

Thus, at least one of the pass voltage applied to word lines corresponding to the first group (a) and the pass voltage applied to word lines corresponding to the second group (b) is controlled according to the temperature measured in the temperature sensor 150.

A technical spirit of the inventive concept is not limited to the things described in FIG. 5. According to exemplary embodiments of the inventive concept, temperature values that can be measured in the nonvolatile memory device 100 may be divided into a plurality of temperature ranges. If the temperature value measured in the nonvolatile memory device 100 is included in a lower temperature range, the level of the pass voltage applied to word lines corresponding to the first group (a) increases and the level of the pass voltage applied to word lines corresponding to the second group (b) decreases.

For example, as the temperature value measured in the temperature sensor 150 decreases, the level of pass voltages applied to the word lines disposed between the selected word line and the ground select line are increased and the level of pass voltages applied to word lines disposed between the selected word line and the string select line are decreased. For a particular example, when a measured temperature changes from plus 50 degrees to minus 20 degrees, the level of the pass voltage applied to word lines corresponding to the first group (a) is increased from 0 volts to 5 volts. For another particular example, when the measured temperature changes from plus 85 degrees to minus 20 degrees, the level of the pass voltage applied to word lines corresponding to the second group (b) is increased from 0 volt to 5 volts.

FIG. 6 is a table illustrating voltages of FIG. 5 generated according to a temperature signal (TS) and a control signal (PC) of FIG. 1.

Referring to FIGS. 1 and 6, the control logic 140 receives the temperature signal (TS) from the temperature sensor 150. The temperature signal (TS) may be one of first through third discrete or digital temperature signals (TS1-TS3). The voltage generator 160 receives the program control signal (PC). The program control signal (PC) may be one of first through third control signals (PC1-PC3).

The first through third temperature ranges (ROT1-ROT3) correspond to discrete temperature signals (TS1-TS3), respectively. The temperature sensor 150 distinguishes each temperature range by the measured temperature value. The temperature sensor 150 transfers a temperature signal corresponding to the distinguished temperature range to the control logic 140. For example, in the case that the distinguished temperature range is the second range (ROT2), the temperature sensor 150 transfers the second temperature signal (TS2) to the control logic 140.

The first through third temperature signals (TS1-TS3) correspond to the first through third control signals (PC1-PC3), respectively. The control logic 140 transfers a control signal (one of the first through third control signals (PC1-PC3)) corresponding to a received temperature signal to the voltage generator 160. For example, the control logic 140 upon receiving the second temperature signal (TS2) transfers the second control signal (PC2) to the voltage generator 160.

The voltage generator 160 generates a plurality of voltages (the program voltage (Vpgm), the pass voltages and the dummy word line voltages) in response to each of the first through third control signals (PC1-PC3). The generated voltages are provided to the address decoder 120.

In the case of receiving the first control signal (PC1), the voltage generator 160 provides the program voltage (Vpgm), the first pass voltage (Vpass) and the first dummy word line voltage (Vdm1) to the address decoder 120.

In the case of receiving the second control signal (PC2), the voltage generator 160 generates the program voltage (Vpgm), the second and third pass voltages (Vpass2, Vpass3), the second and third dummy word line voltages (Vdm2, Vdm3), and the first ground select voltage (Vgs1). As described in FIG. 4, the address decoder 120 applies the provided voltages to the word lines and the ground select line (GSL) connected to the first string 300.

In the case of receiving the third control signal (PC3), the voltage generator 160 generates the program voltage (Vpgm), the fourth and fifth pass voltages (Vpass4, Vpass5), the fourth and fifth dummy word line voltages (Vdm4, Vdm5), and the second ground select voltage (Vgs2). The address decoder 120 applies the provided voltages to the word lines and the ground select line (GSL) connected to the first string 300.

As an example, referring to FIG. 2, the program voltage (Vpgm) is applied to the second word line (WL2). In this case, the fourth pass voltage (Vpass4) is applied to the 0-th and 1st word lines (WL0, WL1). The fifth pass voltage (Vpass5) is applied to third through (m−1)th word lines (WL3-WLm−1). The first and second dummy word line voltages (Vdm1, Vdm2) are applied to the first and second dummy word lines (DWL1, DWL2), respectively. The second ground select voltage (Vgs2) is applied to the ground select line (GSL).

In another example, the control logic 140 can directly receive a digitized temperature value from the temperature sensor 150. For example, the temperature sensor 150 transfers the measured temperature value to the control logic 140 in response to a call signal (not shown) of the control logic 140. The first through third temperature ranges (ROT1-ROT3) can correspond to the first through third control signals (PC1-PC3), respectively. The control logic 140 distinguishes a temperature range including the received temperature value. The control logic 140 transfers a control signal (one of the first through third control signals (PC1-PC3)) corresponding to the distinguished temperature group to the voltage generator 160. As described in FIG. 6, the voltage generator 160 generates the program voltage and the pass voltages in response to the control signal (one of the first through third control signals PC1-PC3).

Figure 7:
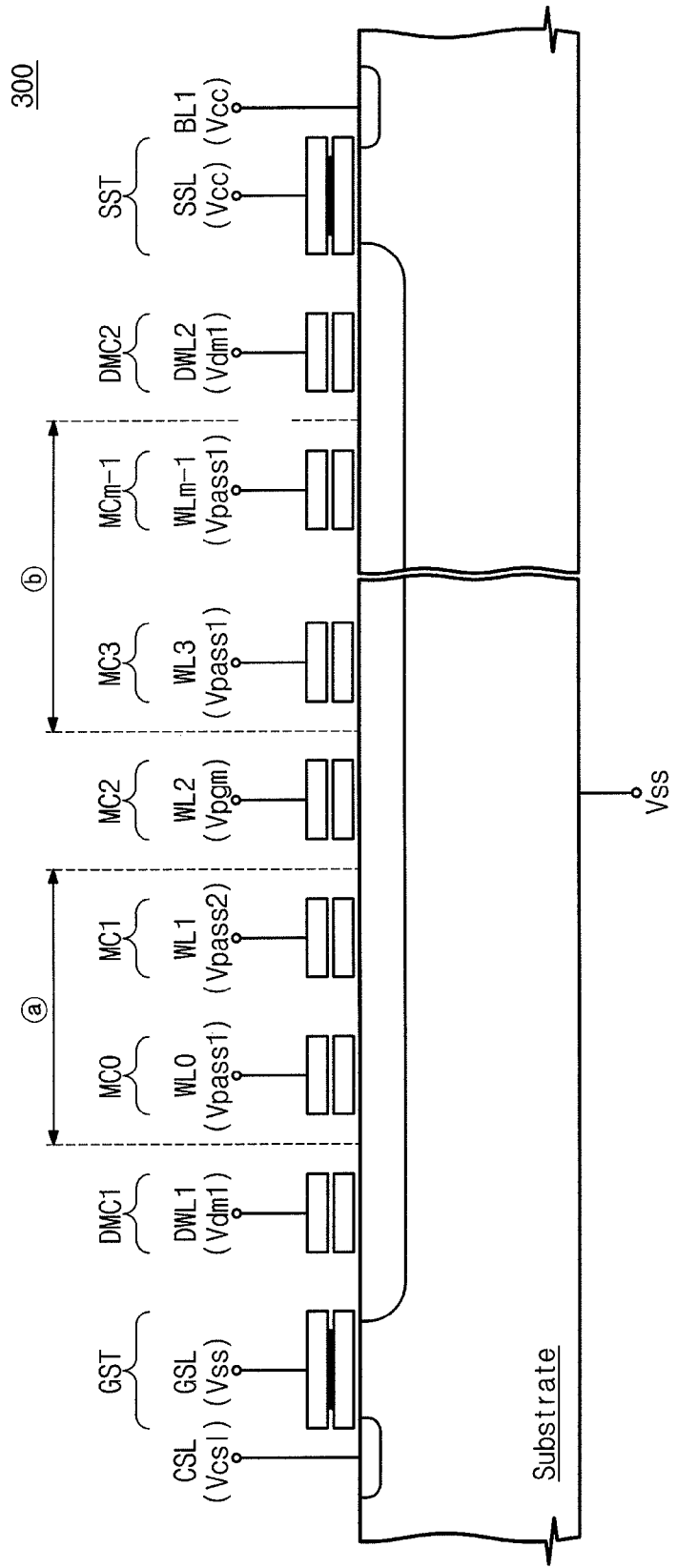
FIG. 7 is a cross-sectional view of NAND string 300 in FIG. 2 illustrating the channel formed by pass voltages applied in accordance with a third embodiment of the inventive concept are applied.

FIG. 7 is a cross-sectional view NAND string 300 in FIG. 2 illustrating the channel formed by pass voltages applied in accordance with a third embodiment of the inventive concept are applied.

The technical spirit of the inventive concept is not limited to the exemplary embodiment described with reference to FIG. 4. According to exemplary embodiments of the inventive concept, when the temperature value of the nonvolatile memory device 100 is smaller than the reference temperature value, pass voltages connected to at least one of word lines between the selected word line and the ground select line (GSL) can be adjusted accordingly. Thus, the second pass voltage (Vpass2) is applied to at least one of word lines between the selected word line and the ground select line (GSL). The first pass voltage (Vpass1) may be applied to unselected word lines to which the second pass voltage (Vpass2) is not applied. The level of the second pass voltage (Vpass2) is higher than the level of the first pass voltage (Vpass1).

Referring to FIG. 7, the second pass voltage (Vpass2) is applied to the first word line (WL1). The first pass voltage (Vpass1) is applied to the 0-th word line (WL0) and third through (m−1)th word lines (WL3-WLm−1). Thus, voltages are applied to the NAND string 300 in this example in the same manner that voltages are applied to the NAND string 300 in FIG. 3 except that the second pass voltage (Vpass2) is applied to the first word line (WL1).

In a different example other than FIG. 7, when the temperature value of the nonvolatile memory device 100 is smaller than the reference temperature value, pass voltages applied to at least one of word lines between the selected word line and the string select line (SSL) can be controlled accordingly. Thus, the third pass voltage (Vpass3) may be applied to at least one of word lines between the selected word line and the string select line (SSL). The first pass voltage (Vpass1) may be applied to unselected word lines to which the third pass voltage (Vpass3) is not applied. The level of the third pass voltage (Vpass3) is lower than the level of the first pass voltage (Vpass3).

According to various exemplary embodiments of the inventive concept, when the temperature of the nonvolatile memory device 100 is lower than the reference temperature, word lines between the selected word line and the ground select line (GSL) are divided into a plurality of groups and different pass voltages are applied to each of the plurality of groups. The level of the applied pass voltages is higher than the level of the first pass voltage (Vpass1). When the temperature of the nonvolatile memory device 100 is lower than the reference temperature, word lines between the selected word line and the string select line (SSL) are divided into a plurality of groups and different pass voltages are applied to each of the plurality of groups. The level of the applied pass voltages is lower than the level of the first pass voltage (Vpass1).

Figure 8:
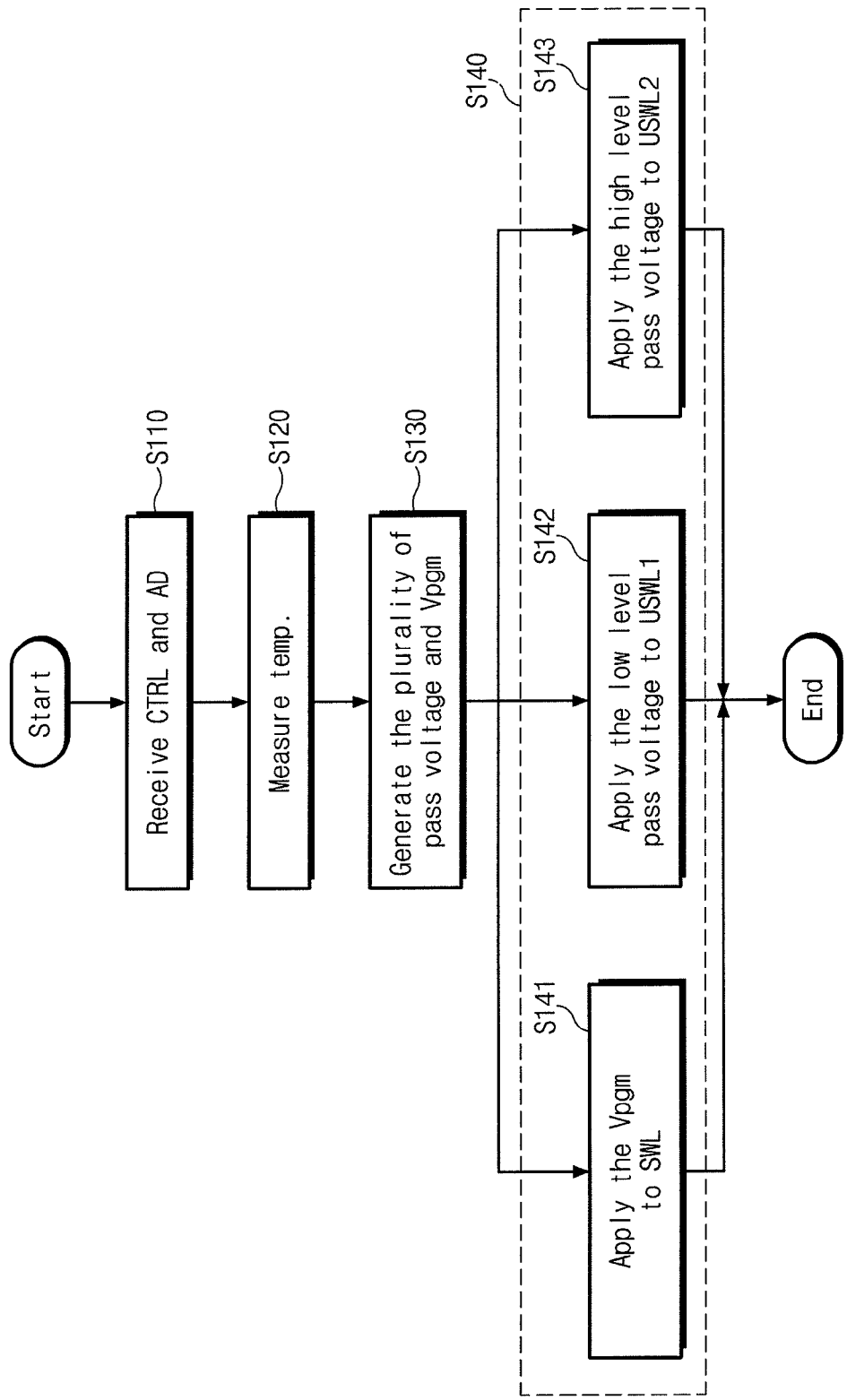
FIG. 8 is a flow chart illustrating a program method of the nonvolatile memory device of FIG. 1.

FIG. 8 is a flow chart illustrating a program method of the nonvolatile memory device of FIG. 1.

Referring to FIGS. 1, 2 and 8, in an initial step S110, the nonvolatile memory device receives the control signal (CTRL) and the address (AD).

In measurement step S120, the temperature of the nonvolatile memory device 100 is measured or detected or reported in response to the control signal (CTRL). The temperature sensor 150 measures the temperature of the nonvolatile memory device 100.

In a step of S130, the program voltage (Vpgm) and a plurality of pass voltages (Vpassj, where j=1, 2, 3, 4 etc.) are generated based on the measured temperature.

Temperature values that can be measured in the nonvolatile memory device 100 may be divided into a plurality of temperature ranges. The nonvolatile memory device 100 distinguishes a temperature range including the measured temperature. On the basis of the distinguished temperature range, the nonvolatile memory device 100 generates the program voltage (Vpgm) and a plurality of pass voltages. According to the distinguished temperature range, at least one of the plurality of pass voltages may be controlled based on the measured temperature.

A programming step S140 includes parallel substeps of S141 through S143. In the programming step S140, the generated program voltage (Vpgm) is applied to the selected word line (SWL) and the plurality of pass voltages are applied to the unselected word lines (USL1, USL2). On the basis of the received address (AD), the nonvolatile memory device 100 selects a word line upon which the programming (writing) operation will be performed.

In substep S141, the program voltage (Vpgm) is applied to the selected word line (SWL). In substep S142, among the generated plurality of pass voltages, a high level pass voltage is applied to unselected word lines (USWL1) between the selected word line (SWL) and the string select line (SSL). In sub step S143, among the generated plurality of pass voltages, a low level pass voltage is applied to unselected word lines (USWL2) between the selected word line (SWL) and the ground select line (GSL).

Figure 9:
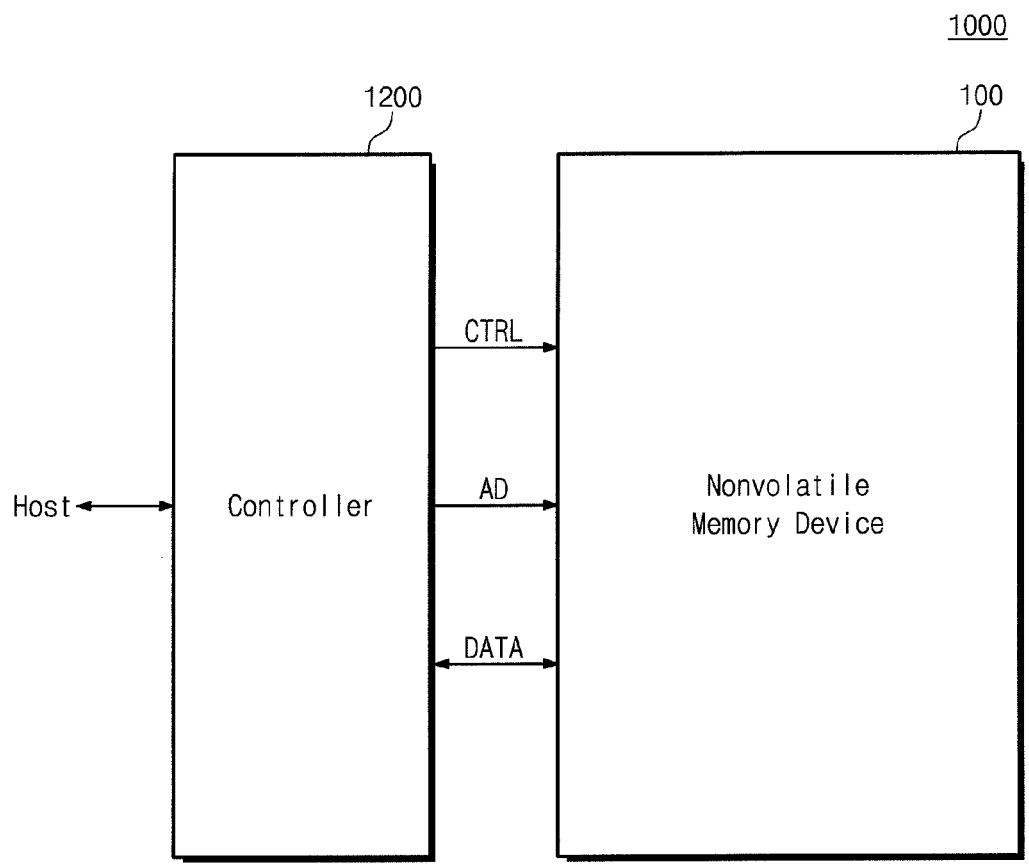
FIG. 9 is a block diagram of a memory system 1000 including the nonvolatile memory device 100 of FIG. 1.

FIG. 9 is a block diagram of a memory system 1000 including the nonvolatile memory device 100 of FIG. 1.

Referring to FIG. 9, the memory system 1000 includes the nonvolatile memory device 100 and a controller 1200. The nonvolatile memory device 100 in FIG. 9 may constituted the same as the nonvolatile memory device 100 described with reference to FIG. 1, or in other forms that include a temperature sensor 150.

The controller 1200 is connected to a host and to the nonvolatile memory device 100. In response to a request from the host, the controller 1200 is configured to access the nonvolatile memory device 100. For example, the controller 1200 is configured to control operations of read, writing, erasure and background of the nonvolatile memory device 100. The controller 1200 is configured to provide an interface between the nonvolatile memory device 100 and the host. The controller 1200 is configured to drive a firmware for controlling the nonvolatile memory device 100.

Referring to FIGS. 1 and 9, the controller 1200 is configured to provide the control signal (CTRL) and the address (AD). The controller 1200 is configured to exchange data with the nonvolatile memory device 100.

The controller 1200 further includes well known constituent elements such as a random access memory (RAM), a processing unit, a host interface and a memory interface (not shown). The RAM is used as at least one of an system memory of a processing unit, a cache memory between the nonvolatile memory device 1100 and the host, and a buffer memory between the nonvolatile memory device 1100 and the host. The processing unit controls all the memory device's 100 operations.

The host interface includes protocols for performing data exchange between the host and the controller 1200. For Example, the controller 1200 is configured to communicate with the outside (host) through at least one of various interface protocols such as a universal serial bus (USB) protocol, a multimedia card (MMC) protocol, a peripheral component interconnection (PCI) protocol, a PCI-express protocol, an advanced technology attachment (ATA) protocol, a serial-ATA protocol, a parallel-ATA protocol, a small computer small interface (SCSI) protocol, an enhanced small disk interface (ESDI) protocol and an integrated drive electronics (IDE) protocol. The memory interface interfaces with the nonvolatile memory device 1100. For example, the memory interface includes a NAND interface and a NOR interface.

The memory system 1000 may be configured to further include an error correction (ECC) block (not shown). The error correction block is configured to detect and correct an error read from the nonvolatile memory device 1100 using an error correction code (ECC). The error correction block may be provided as a constituent element of the nonvolatile memory device 100.

The controller 1200 and the nonvolatile memory device 100 can be integrated into one semiconductor substrate. The controller 1200 and the nonvolatile memory device 100 may be integrated into one semiconductor device to constitute a memory card. For example, the controller 1200 and the nonvolatile memory device 100 are integrated into one semiconductor device to constitute a memory card such as a personal computer memory card international association (PCMCIA) card, a compact flash card (CF), a smart media card (SMC), a memory stick, a multimedia card (MMC, RS-MMC, MMC-micro), a SD card (SD, miniSD, microSD, SDHC), a universal flash memory device (UFS), etc.

The controller 1200 and the nonvolatile memory device 100 may be integrated into one semiconductor device to constitute a solid state drive (SSD). The solid state drive (SSD) includes a storage device configured to store data in a semiconductor memory.

The memory system 1000 may be provided as one of various constituent elements of electronic devices such as an ultra mobile PC (UMPC), a workstation, a net book, a PDA (personal digital assistant), a portable computer, a web tablet, a wireless phone, a mobile phone, a smart phone, an e-book, a portable multimedia player (PMP), a portable game machine, a navigation device, a black box, a digital camera, a digital multimedia broadcasting (DMB) player, a digital audio player, a digital audio player, a digital picture recorder, a digital picture player, a digital video recorder, a digital video player, a device that can transmit and/or receive data in a wireless communication environment, one of various electronic devices constituting a home network, one of various electronics devices constituting a computer network, one of various electronics constituting a telematics network, a RFID device, or one of various constituent elements constituting a computing system.

The nonvolatile memory device 100 or the memory system 1000 may be mounted in various types of packages. For example, the nonvolatile memory device 100 or the memory system 1000 can be mounted by various types of packages such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP), wafer-level processed stack package (WSP) and mounted.

Figure 10:
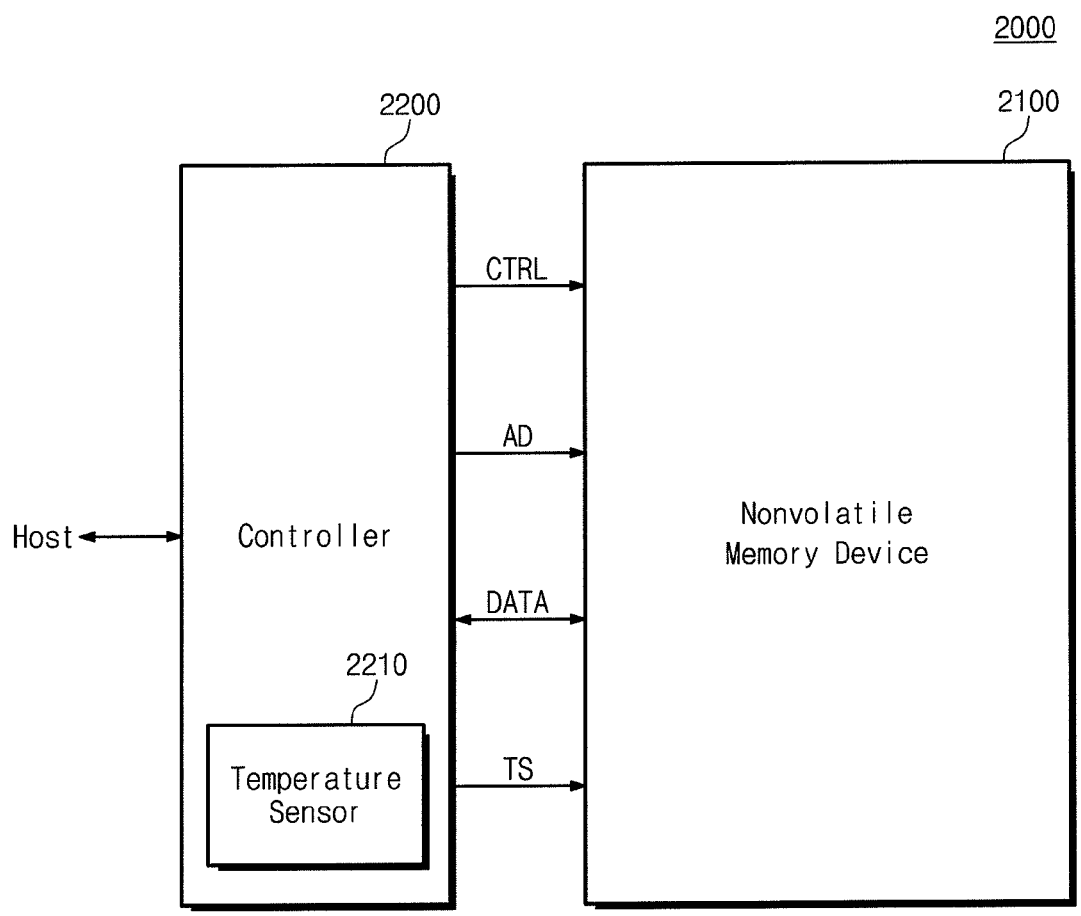
FIG. 10 is a block diagram of a memory system 2000 including a nonvolatile memory device 2100 and a controller 2200 that includes a temperature sensor 2210.

FIG. 10 is a block diagram of a memory system 2000 having controller 2200 that includes a temperature sensor 2210. Referring to FIG. 10, the memory system 2000 includes a nonvolatile memory device 2100 and the controller 2200.

The nonvolatile memory device 2100 in FIG. 10 is constituted the same as the nonvolatile memory device 100 illustrated in FIG. 1 except for not including the temperature sensor 2210. The nonvolatile memory device 2100 instead receives the temperature signal (TS) from the controller 2200. Based on the received temperature signal (TS), the control logic 140 transfers the program control signal (PC) to the voltage generator 160.

The controller 2200 illustrated in FIG. 10 is constituted the same as the controller 1200 illustrated in FIG. 9 except for including the temperature sensor 2210. The temperature sensor 2210 measures the temperature of the memory system 2210, and may be constituted the same as temperature sensor in FIG. 1. When a program (write) operation is performed on the nonvolatile memory device 2100, the controller 2200 transfers the control signal (CTRL), the address (AD) and the temperature signal (TS) to the nonvolatile memory device 2100.

Figure 11:
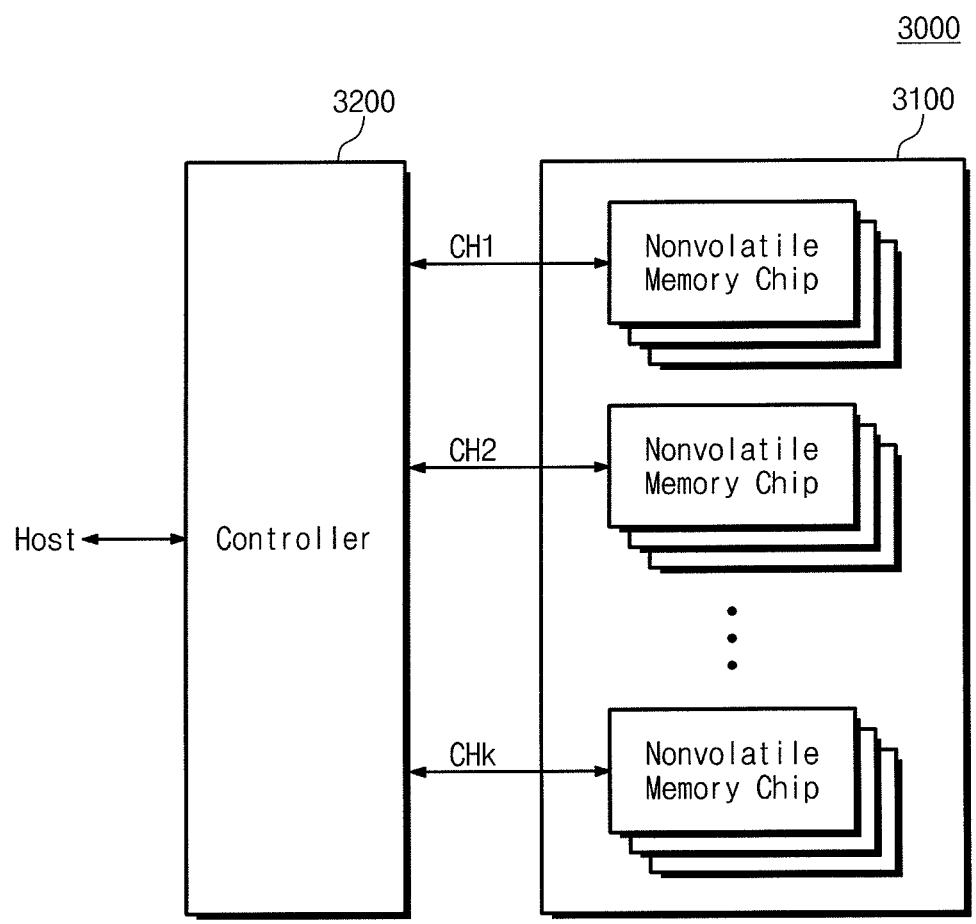
FIG. 11 is a block diagram of a variation 3000 of the memory system 1000 of FIG. 9.

FIG. 11 is a block diagram of a variation 3000 of the memory system 1000 of FIG. 9.

A memory system 3000 includes a nonvolatile memory device 3100 and a controller 3200. The nonvolatile memory device 3100 includes a plurality of memory devices. Each nonvolatile memory device can be constituted the same as the nonvolatile memory device 100 described with reference to FIG. 1. The controller 3200 can be constituted the same as the controller 1200 described with reference to FIG. 9.

The plurality of nonvolatile memory devices is divided into a plurality of groups. Each group among the plurality of nonvolatile memory devices 100 is configured to communicate with the controller 3200 through one common channel (e.g., CH1). In FIG. 10, the plurality of nonvolatile memory devices 100 is shown configured to communicate with the controller 3200 through first through kth channels (CH1-CHk).

Alternatively, each nonvolatile memory device in 3100 can be constituted the same as the nonvolatile memory device 2100 described with reference to FIG. 10. The controller 3200 can be constituted the same as the controller 2200 described with reference to FIG. 10. In this case, when performing a program operation, each nonvolatile memory device receives the temperature signal (TS) from the controller 3200 through the channel corresponding to the nonvolatile memory device. Based on the temperature signal (TS), a program (write) operation is performed on each nonvolatile memory device.

Figure 12:
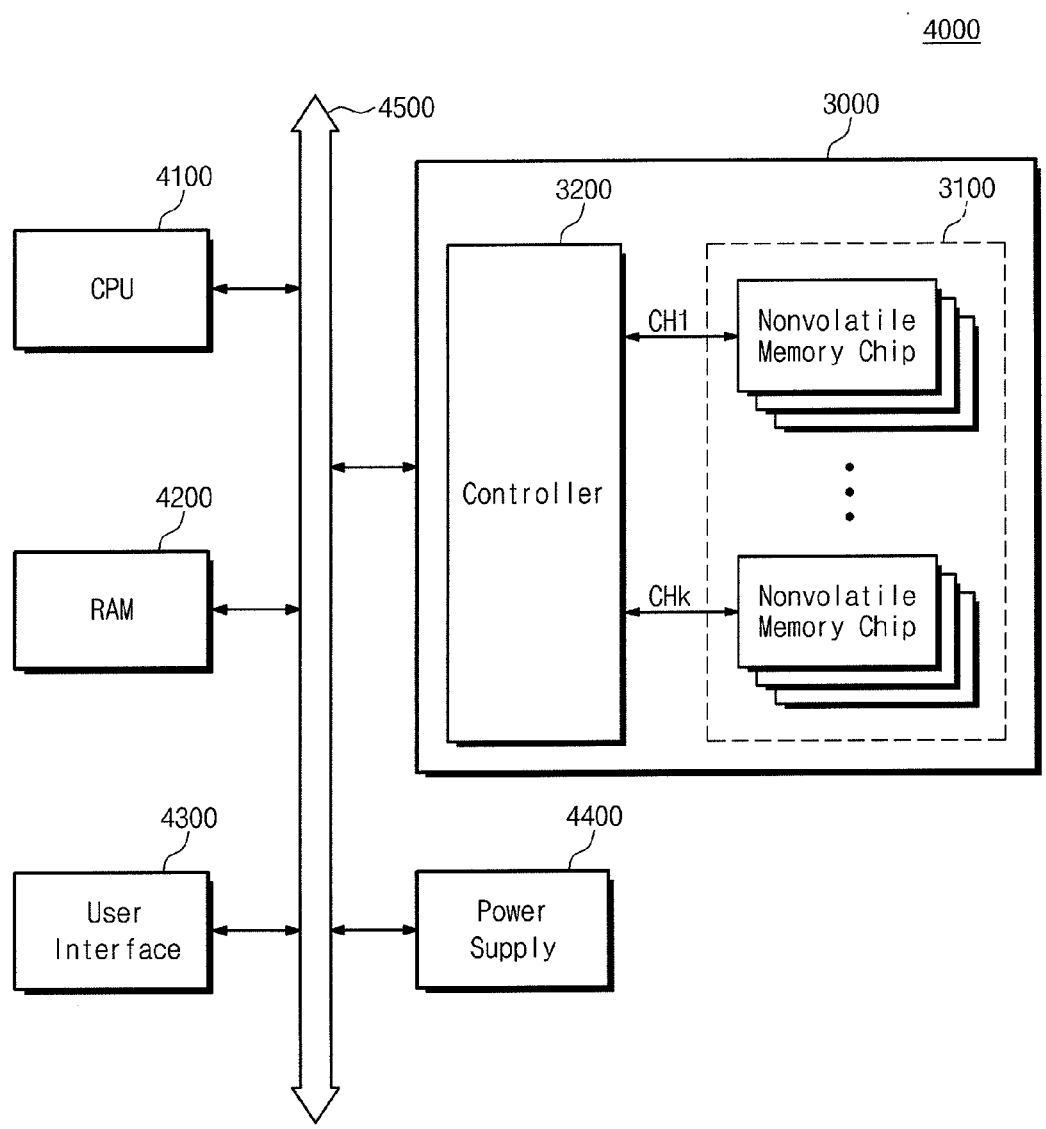
FIG. 12 is a block diagram of a computing system including the memory system 3000 of FIG. 11.

FIG. 12 is a block diagram illustrating a computing system 4000 including the memory system 3000 of FIG. 11.

Referring to FIG. 12, the computing system 4000 includes a central processing unit (CPU) 4100, a random access memory (RAM) 4200, a user interface 4300, a power supply 4400 and a nonvolatile memory system 3000.

The nonvolatile memory system 3000 is electrically connected to the central processing unit (CPU) 4100, the random access memory (RAM) 4200, the user interface 4300 and the power supply 4400 through a system bus 4500. Data provided through the user interface 4300 or processed by the central process unit (CPU) 4100 is stored in the nonvolatile memory system 3000. The nonvolatile memory system 3000 includes a nonvolatile memory device 3100 and a controller 3200.

In FIG. 12, the nonvolatile memory device 3100 includes a plurality of nonvolatile memory chips, and is connected to the system bus 4500 through the controller 3200. However, the nonvolatile memory device 3100 may be configured to be directly connected to the system bus 4500 in which case, the function of the controllers 1200 and 3200 described with reference to FIGS. 9 and 11 is performed by the central processing unit 4100.

In FIG. 12, the memory system 3000 of FIG. 11 is provided. However, the memory system 3000 may be replaced with the memory system 1000 of FIG. 9 or the memory system 2000 of FIG. 10.

The computing system 4000 may be configured to include all the memory systems 1000, 2000 and 3000 described with reference to FIGS. 9, 10 and 11.

According to exemplary embodiments of the inventive concept, unselected word lines are divided into a plurality of groups and different pass voltages are respectively applied to the groups according to the measured temperature. Thus, there is a reduction of the occurrence of program disturb due to a movement of electrons in accordance with a potential difference of the inside of a channel boosted in a low temperature. As a result, a nonvolatile memory device having improved reliability and a program method thereof are provided.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A nonvolatile memory device, comprising:
   a string select line and a ground select line connected to a memory cell array, the memory cell array comprising a NAND string;
   first and second word lines connected to the NAND string;
   a third word line connected to the NAND string, the third word line being disposed between the first and second word lines, the first word line being disposed between the third word line and the ground select line, the second word line being disposed between the third word line and the string select line;
   a temperature sensor configured to measure the temperature of the nonvolatile memory device; and
   a voltage generator configured to generate a first pass voltage and a second pass voltage and a program voltage,
   wherein while a program operation is performed, the program voltage is applied to the third word line, and the first pass voltage is applied to the first word line, and the second pass voltage is applied to the second word line, and the level of at least one of the first and second pass voltages is controlled according to a measured temperature, and wherein when the measured temperature is lower than a reference temperature the second pass voltage is less than the first pass voltage.

2. The nonvolatile memory device of claim 1, wherein the nonvolatile memory device controls the level of at least one of the first and second pass voltages according to whether the measured temperature is within a first temperature range or within a second temperature range.

3. The nonvolatile memory device of claim 1, wherein the level of the first pass voltage is different from the level of the second pass voltage.

4. The nonvolatile memory device of claim 3, wherein the level of the second pass voltage is higher than the level of the first pass voltage and the level of the first pass voltage is reduced if the measured temperature value decreases.

5. The nonvolatile memory device of claim 3, wherein the level of the second pass voltage is higher than the level of the first pass voltage and the level of the second pass voltage increases if the measured temperature value decreases.

6. The nonvolatile memory device of claim 1,
wherein the memory cell array comprising the NAND string comprises:
first through third memory cells connected to the first through third word lines, respectively;
a string select transistor connected to the string select line; and
a ground select transistor connected to the ground select line, and
wherein the first word line is disposed between the third word line and the string select line, and the second word line is disposed between the third word line and the ground select line.

7. The nonvolatile memory device of claim 6, wherein the voltage generator is configured to generate a ground select line voltage, the ground select line voltage is applied to the ground select line, and the level of the ground select line voltage increases if the measured temperature decreases.

8. The nonvolatile memory device of claim 7, wherein the level of the ground select line voltage is lower than the threshold voltage of the ground select transistor.

9. The nonvolatile memory device of claim 1, wherein the nonvolatile memory device further comprises:
an address decoder connected between the voltage generator and each of the first through third word lines; and
a control logic controlling the address decoder and the voltage generator,
wherein the first and second pass voltages, and the program voltage are provided to the address decoder, and
wherein in response to the control of the control logic, the address decoder applies the program voltage to the third word line, applies the first pass voltage to the first word line and applies the second pass voltage to the second word line.

10. The nonvolatile memory device of claim 9, wherein the temperature sensor is configured to measure the temperature of the nonvolatile memory device in response to a call signal received from the control logic and to transfer to the control logic a temperature signal based on the measured temperature.

11. The nonvolatile memory device of claim 10,
wherein the control logic is configured to send a program control signal to the voltage generator based on the received temperature signal and
wherein the voltage generator is configured to generate the first and second pass voltages, and
the program voltage on based on the program control signal.

12. The nonvolatile memory device of claim 11, wherein the temperature sensor is configured to output the temperature signal indicating which temperature range the measured temperature is within among a plurality of temperature ranges and to transfer the temperature signal to the control logic.

13. A memory system, comprising:
a nonvolatile memory device comprising a string select line and a ground select line connected to a memory cell array, the memory cell array comprising a NAND string and first through third word lines connected to the NAND string and wherein the nonvolatile memory device applies first and second pass voltages and a program voltage in response to a control signal; and
a memory controller configured to generate the control signal based on a measured temperature of the nonvolatile memory device,
wherein when a program operation is performed, the nonvolatile memory device is configured to control the level of at least one of the first and second pass voltages based on the control signal, and to apply the program voltage to the third word line, to apply the first pass voltage to the first word line and to apply the second pass voltage to the second word line,
wherein the third word line is disposed between the first and second word lines,
wherein the first word line is disposed between the third word line and the ground select line and the second word line is disposed between the third word line and the string select line, and
wherein when the measured temperature is lower than a reference temperature the second pass voltage is less than the first pass voltage.

14. The memory system of claim 13,
wherein the level of the second pass voltage is higher than the level of the first pass voltage, and
wherein if the measured temperature value decreases, the level of the first pass voltage is reduced and the level of the second pass voltage is increased.

15. The memory system of claim 13, wherein the memory controller comprises a temperature sensor measuring the temperature of the nonvolatile memory device and generating the temperature signal according to the measured temperature.

16. The memory system of claim 13, wherein the nonvolatile memory device and the memory controller implement a solid state drive.

17. The memory system of claim 13, wherein the nonvolatile memory device and the memory controller implement a memory card.

18. A program method of a nonvolatile memory device including a string select line and a ground select line connected to a memory cell array, the memory cell array comprising first through third word lines connected to the NAND string, the program method comprising:
measuring the temperature of the nonvolatile memory device;
generating first and second pass voltages and a program voltage, wherein the level of at least one of the first and second pass voltages is controlled according to a measured temperature; and
applying the program voltage to the third word line, applying the first pass voltage to the first word line and applying the second pass voltage to the second word line,
wherein the first word line is disposed between the third word line and the ground select line and the second word line is disposed between the third word line and the string select line, and wherein when the measured temperature is lower than a reference temperature the second pass voltage is less than the first pass voltage.

19. The program method of claim 18, wherein generating the voltages comprises:

generating the first and second pass voltages having the same level while the measured temperature is higher than a predetermined temperature.

20. The program method of claim 19, wherein if the measured temperature is decreases, the level of the first pass voltage is decreased and the level of the second pass voltage is increased.

* * * * *